United States Patent
Owens et al.

(10) Patent No.: US 12,111,342 B2
(45) Date of Patent: Oct. 8, 2024

(54) ELECTRO-OPTICAL SENSOR FOR HIGH INTENSITY ELECTRIC FIELD MEASUREMENT

(71) Applicant: National Technology & Engineering Solutions of Sandia, LLC, Albuquerque, NM (US)

(72) Inventors: Israel Owens, Albuquerque, NM (US); Andrew Charles Biller, Albuquerque, NM (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 178 days.

(21) Appl. No.: 18/095,153

(22) Filed: Jan. 10, 2023

(65) Prior Publication Data
US 2023/0228800 A1 Jul. 20, 2023

Related U.S. Application Data

(60) Provisional application No. 63/301,391, filed on Jan. 20, 2022.

(51) Int. Cl.
*G01R 27/04* (2006.01)
*G01R 29/08* (2006.01)
(Continued)

(52) U.S. Cl.
CPC ....... *G01R 29/0885* (2013.01); *G02F 1/0136* (2013.01); *G02F 1/0311* (2013.01);
(Continued)

(58) Field of Classification Search
CPC .. G01R 15/246; G01R 15/242; G01R 15/241; G01R 15/247; G01R 33/0322;
(Continued)

(56) References Cited

U.S. PATENT DOCUMENTS 4,531,092 A * 7/1985 Shibano ............. G01R 33/0322
324/96
5,272,433 A * 12/1993 Simonelli ............. G01R 29/12
324/96
(Continued)

OTHER PUBLICATIONS

Huiskamp, T. et al., "B-Dot and D-Dot Sensors for (Sub)Nanosecond High-Voltage and High-Current Pulse Measurements," IEEE Sensors Journal, 2016, vol. 16, pp. 3792-3801.
(Continued)

*Primary Examiner* — Thang X Le
(74) *Attorney, Agent, or Firm* — Kevin W. Bieg (57) ABSTRACT

The present invention is directed to an electro-optical sensor for high intensity electric field measurement. The electro-optical sensor was used to measure a strong 118 MV/m narrow pulse width (~33 ns) electric field in the magnetically insulated transmission line (MITL) of a pulsed power accelerator. Accurately measuring these high fields using conventional pulsed power diagnostics is difficult due to the strength of interfering particles and fields. The electro-optical sensor uses a free space laser beam with a dielectric crystal sensor that is highly immune to electromagnetic interference and does not require an external calibration.

10 Claims, 6 Drawing Sheets

(51) Int. Cl.
*G02F 1/01* (2006.01)
*G02F 1/03* (2006.01)

(52) U.S. Cl.
CPC ...... *G02F 2201/58* (2013.01); *G02F 2202/20* (2013.01); *G02F 2202/36* (2013.01)

(58) Field of Classification Search
CPC .............. G01R 33/0327; G01R 33/022; G01R 33/032; G01R 31/2891; G01R 31/311; G01R 31/2887; G01R 31/2886; G01D 5/353; G01B 11/18; G02F 2201/307; G02B 6/124; G02B 6/02085; G01N 25/04; G01N 25/02; G01N 25/68; G01N 33/2811
See application file for complete search history.

(56) References Cited

U.S. PATENT DOCUMENTS

2009/0219378 A1* 9/2009 Nakamura ................ G02F 1/29 369/18
2010/0264904 A1* 10/2010 Wu ..................... G01R 29/0885 324/97

OTHER PUBLICATIONS

Cecelja, F. et al., "Lithium Niobate Sensor for Measurement of DC Electric Fields," IEEE Transactions on Instrumentation and Measurement, 2001, vol. 50, pp. 465-469.

Passard, M. et al., "Optimization of an Optical Device for Low-Frequency Electric Field Measurement," Proceedings of SPIE: Applications of Optical Fiber Sensors, 2000, vol. 4074, pp. 382-389.

Johnson, E. K. et al., "Electric Field Sensing with a Hybrid Polymer/Glass Fiber," Applied Optics, 2007, vol. 46, pp. 6953-6958.

Flanagan, T. M. and Chantler, G. R., "Estimates of Pulsed Electric Fields Using Optical Measurements," Sandia Technical Report 2013-8205, 2013, Sandia National Laboratories, Albuquerque, NM, 18 pages.

Owens, I. et al., "Electro-Optical Measurement of Electric Fields for Pulsed Power Systems," 2019, 46th ICOPS, Orlando, FL, 1 page.

Brubaker, M. A. and Yakymyshyn, C. P. "Pockels Cell Voltage Probe for Noninvasive Electron-Beam Measurements," Applied Optics, 2000, vol. 39, pp. 1164-1167.

Arteche, A. et al., "Beam Measurements at the CERN SPS Using Interferometric Electro-Optic Pickups," 2019, 8th International Beam Instrument Conference, Malmo, Sweden, 4 pages.

Williams J. et al., "Non-invasive Beam Detection in a High Average Power Electron Accelerator," Optical Society of America, 2014, CLEO 2014, Paper JTu4A.89, 2 pages.

Stefen, B. et al., "Spectral Decoding Electro-Optic Measurements for Longitudinal Bunch Diagnostics at the DESY VUV-FEL," Proceedings of the 27th International Free Electron Laser Conference, 2005, Stanford, CA, 3 pages.

Consoli, F. et al., "Time-Resolved Absolute Measurements by Electro-Optic Effect of Giant Electromagnetic Pulses Due to Laser-Plasma Interaction in Nanosecond Regime," Scientific Reports, 2016, vol. 6, 27889, 8 pages.

Robinson, T. S. et al., "Low-Noise Time-Resolved Optical Sensing of Electromagnetic Pulses from Petawatt Laser-Matter Interactions," Scientific Reports, 2017, vol. 7, 983, 12 pages.

Peng, J. et al., "Recent Progress on Electromagnetic Field Measurement Based on Optical Sensors," Sensors, 2019, vol. 19, 2860, 28 pages.

* cited by examiner

ELECTRO-OPTICAL SENSOR FOR HIGH INTENSITY ELECTRIC FIELD MEASUREMENT

CROSS-REFERENCE TO RELATED APPLICATION

This application claims the benefit of U.S. Provisional Application No. 63/301,391, filed Jan. 20, 2022, which is incorporated herein by reference.

STATEMENT OF GOVERNMENT INTEREST

This invention was made with Government support under Contract No. DE-NA0003525 awarded by the United States Department of Energy/National Nuclear Security Administration. The Government has certain rights in the invention.

STATEMENT REGARDING PRIOR DISCLOSURES BY THE INVENTOR OR A JOINT INVENTOR

The following disclosure is submitted under 35 U.S.C. 102(b)(1)(A): Israel Owens, Chris Grabowski, Andrew Biller, Ben Ulmen, Nathan Joseph, Ben Hughes, Sean Coffey, Debra Kirschner, and Ken Struve, "Electro-optical measurement of intense electric field on a high energy pulsed power accelerator," *Scientific Reports* 11, 10702 (2021). The subject matter of this disclosure was conceived of or invented by the inventors named in this application.

FIELD OF THE INVENTION

The present invention relates to the measurement of electric fields and, in particular, to an electro-optical sensor for high intensity electric field measurement.

BACKGROUND OF THE INVENTION

Electro-optical based sensors are ideal for noninvasive measurement of very high electric field strength because they are immune to many issues associated with conventional diagnostics. Sensors such as D-dot probes measure derivative responses requiring integration or other nonlinear post-processing of the sensor signal to obtain a measurement. See T. Huiskamp et al., *IEEE Sensors J.* 16(10), 3792 (2016). In contrast, with an electro-optical sensor (EOS) there is a direct linear relationship between the optical signal from the sensor and the electric field to be measured, and the EOS response does not require external calibration or mathematical integration of the signal. An EOS typically utilizes dielectric materials to transmit, sense and receive optical signals to and from a remote data acquisition system. The galvanic isolation inherent with dielectric materials is important as metallic-based sensing elements, such as the conventional D-dot probes, are more prone to noise, improper electrical impedance matching configurations and signal reflections.

To date, the vast amount of literature on electro-optical devices has primarily focused on electro-optical crystal materials and applied voltage levels required for light switching applications, and not measurement of the driving electric field. See A. Yariv, *Optical Electronics*, Holt, Rinehart, and Winston, 3rd Edition (1985). When the driving field is discussed, existing papers are mostly limited to low DC electric field measurement or low to moderate repetition rate measurement of AC electric fields. See F. Cecelja et al., *IEEE Trans. Instrum. Meas.* 50(2), 465 (2001); and M. Passard et al., *Proc. SPIE* 4074: *Appl. Opt. Fiber Sensors* (2000). Fiber optical cables can be used as electric field sensors but fail in high field strength environments where particle interaction with the fiber material can attenuate and dilute the desired signal through radiation darkening and fluorescence. See E. Johnson et al., *Appl. Opt.* 46, 6953 (2007). There is a paucity of papers on high field narrow pulse width electric field measurements using bulk EOS crystals. See T. M. Flanagan and G. R. Chandler, "Estimates of pulsed electric fields using optical measurements," *Sandia Technical Report* 2013-8205 (2013); and I. Owens et al., "Electro-optical measurement of electric fields for pulsed power systems," in $46^{th}$ *ICOPS* (2019). Several experiments have been performed where bulk EOS crystals have been used for electron beam position monitoring in accelerators, but not explicit measurement of electric field components. See M. A. Brubaker and C. P. Yakymyshyn, *Appl. Opt.* 39, 1164 (2000); A. Arteche et al., "Beam measurements at the CERN SPS using interferometric electro-optic pickups," In $8^{th}$ *International Beam Instrument Conference* (2019); J. Williams et al., "Non-invasive beam detection in a high average power electron accelerator" In *CLEO:* 2014, *OSA Technical Digest (Online), Paper JTu*4A.89 (Optical Society of America, 2014); and B. Steffen et al., "Spectral decoding electro-optic measurements for longitudinal bunch diagnostics at the DESY VUV-FEL" in Proc. $27^{th}$ *Int. Free Electron Laser Conference* (2005). Consoli and Robinson describe electro-optical measurements of electromagnetic pulses generated by laser-plasma interaction in the nanosecond regime where they measured a maximum external electric field of 261 kV/m. See F. Consoli et al., *Sci. Rep.* 6, 27889 (2016); and T. Robinson et al., *Sci. Rep.* 7, 1 (2017). A comprehensive review of various approaches to measure electric fields is given in Peng. See J. Peng et al., *Sensors* 19, 2860 (2019).

SUMMARY OF THE INVENTION

The present invention is directed to an electro-optical sensor for high intensity electric field measurement, comprising a light source that provides a light beam; a first linear polarizer that produces a linearly polarized light beam from the light beam; an electro-optical crystal that rotates the polarization of the linearly polarized light beam that propagates along an optical axis of the electro-optical crystal to provide a rotated linearly polarized light beam whose rotation is dependent upon the strength of an electric field applied transverse to the optical axis of the crystal; a second linear polarizer that is aligned perpendicular to the first linear polarizer, thereby providing crossed polarizers, such that the second linear polarizer transmits a light beam dependent upon the rotation of the polarization by the electro-optical crystal; and a photodetector that measures the intensity of the transmitted light beam.

As an example of the utility of the invention, an experiment to electro-optically measure an extremely high electric field (118 MV/m) with a relatively narrow pulse width (~33 ns) in the magnetically insulated transmission line (MITL) region of the High Energy Radiation Megavolt Electron Source III (HERMES III or HIII) pulsed power accelerator was performed. See J. J. Ramirez et al., "Performance of the Hermes-III gamma ray simulator," In *7th Pulsed Power Conference*, Monterey, CA, USA (1989). Numerous harsh environmental challenges in the region where the EOS was placed were overcome to perform the measurement, and the results agreed well with the theory, numerical calculations and an earlier benchtop laboratory experiment. These results represent one of the highest overall external electric fields measured electro-optically in either a pulsed power accelerator or in related science experiments.

BRIEF DESCRIPTION OF THE DRAWINGS

The detailed description will refer to the following drawings, wherein like elements are referred to by like numbers.

DETAILED DESCRIPTION OF THE INVENTION

Figure 1:
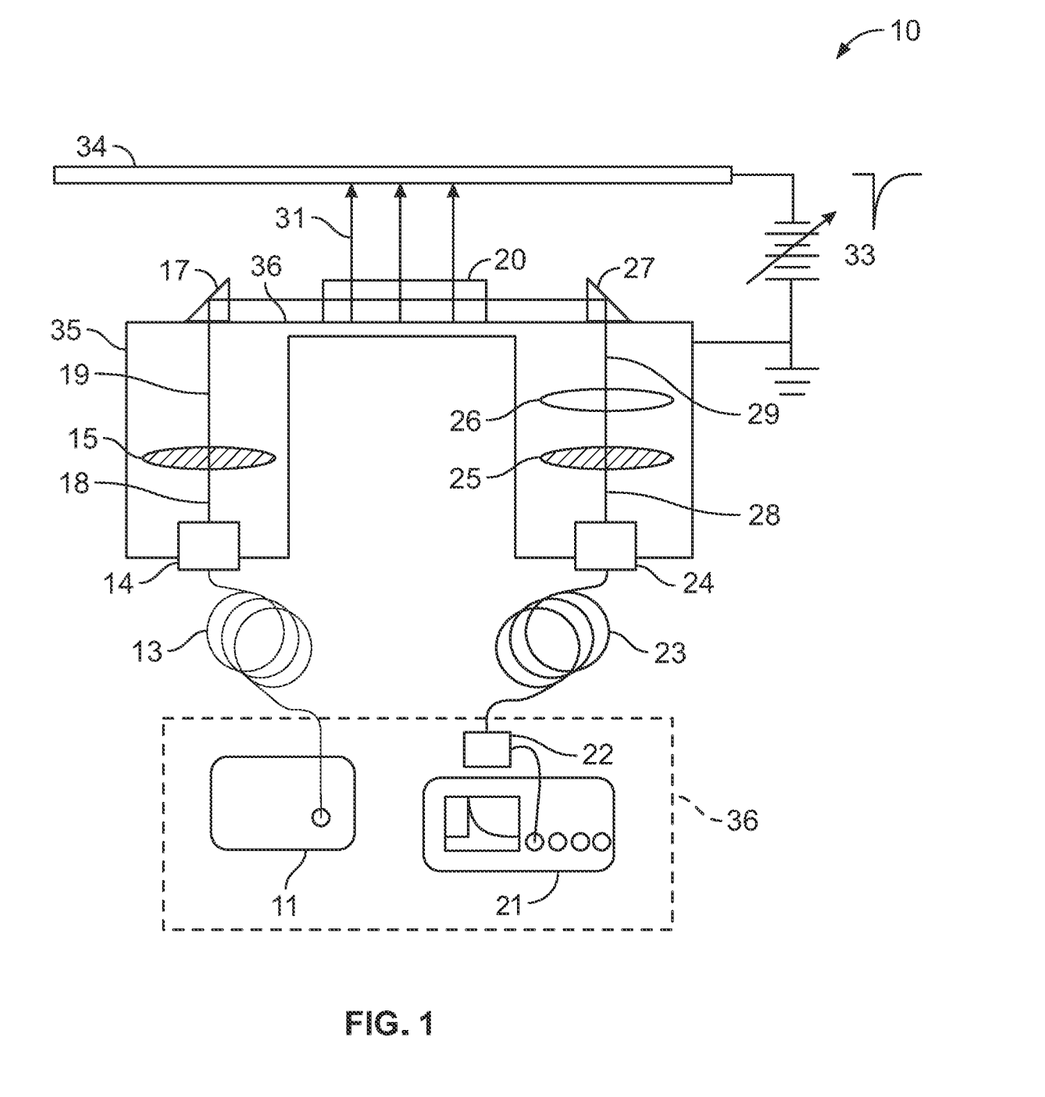
FIG. 1 is a schematic illustration of an exemplary EOS benchtop laboratory setup.

FIG. 1 is a schematic illustration of an EOS setup 10. The main components of this EOS setup 10 comprise a fiber-coupled laser 11, first and second fiber coupling lenses 14 and 24, crossed first and second linear polarizers 15 and 25, first and second turning mirrors 17 and 27, an electro-optical crystal 20, a quarter waveplate 26, and a photodetector 22. An electric field 31 is applied transversely to a polarized light beam 19 passing through the electro-optical crystal 20 with a high voltage pulsed power supply 33 connected to a cathode plate 34 and an anode housing 35 containing the optical components. The EOS 10 can be designed to allow independent in situ adjustment of the optical beam alignment, light polarization and phase within the contained anode housing 35. In general, the light source 11 can be a coherent laser light source, although a free space light emitting diode can also be used. Infrared or visible laser light can be used, although changing the wavelength typically involves a tradeoff between the sensitivity of the electro-optical response and the detector efficiency. The amount of laser power required depends on the overall optical loss in the system, but will typically be 100s of micro Watts to provide a detectable signal. The fiber-coupled laser 11 can be coupled into a single-mode fiber 13 which couples the light into the anode housing 35 via the first fiber coupling lens 14. The input-coupled light 18 is then linearly polarized by the first linear polarizer 15. For example, the linear polarizer 15 can be a nanoparticle-coated linear polarizer, although mainly types of linear polarizers can be used. A first right-angle mirror 17 mounted on the anode 36 then turns the linearly polarized light 19 through the electro-optical crystal 20 along the direction of the optical axis of the crystal. The Pockels effect produces birefringence in the electro-optical crystal 20 induced by the electric field 31. The electric field 31 thereby rotates the polarization of the linearly polarized light beam passing through the electro-optical crystal 20 between 0° and 90°. The electro-optical crystal 20 can be any noncentrosymmetric medium that lacks inversion symmetry so as to produce a Pockels effect. Lithium niobate ($LiNO_3$) is an ideal material for the EOS crystal as it has a relatively high electro-optical coefficient and durable physical properties. However, other electro-optical crystals can also be used, such as beta barium borate (BBO) and potassium dihydrogen phosphate (KDP). The second right-angle mirror 27 redirects the rotated linearly polarized light 29 to a second linear polarizer 25 that is aligned perpendicular to the first linear polarizer 15, thereby providing crossed linear polarizers. A quarter waveplate 26 can be added between the crossed linear polarizers 15 and 25 to offset the natural birefringence of the electro-optical crystal 20 that can skew the signal reference established by the cross polarization. The crossed linear polarizers 15 and 25 preferably have a high extinction ratio (e.g., 10,000:1). The high polarization extinction ratio of the crossed polarizers enhances the signal-to-noise ratio and serves as a reference for the optical signal level. If there is no electric field, no rotation of the polarized light beam occurs in the electro-optical crystal 20 and, therefore, no light will be transmitted through the second linear polarizer 25. Conversely, when the crystal 20 is exposed to an electric field 31, the rotated light beam 28 transmitted through the second linear polarizer 25 contains an amplitude-modulated signal. The transmitted light 28 can be coupled out of the EOS via the second fiber coupling lens 24 into a multi-mode fiber 23 to the photodetector 22 which measures the intensity of the transmitted light 28, thereby providing a time-resolved electric field measurement. For visible wavelengths, the photodetector 22 can be a high-speed (1 GHz) silicon photodetector. For infrared wavelengths (e.g., 900 to 1550 nm), indium gallium arsenide (InGaAs) also provides high speed and responsivity at a relatively low cost. Other photodetectors, such as photomultiplier tubes, can also be used. For example, the output of the photodetector 22 and be recorded on an oscilloscope 21. The fiber-coupled laser 11, photodetector 22, and oscilloscope 21 can be housed in a screen box 36.

In an exemplary low electric field EOS benchtop laboratory setup, 532-nm light from a 250-mW (reduced to 125 mW) continuous wave, single transverse mode, low-noise 532-nm fiber-coupled laser was coupled into a 25-meter long single-mode fiber which coupled the light into the anode housing via a first fiber coupling lens. The exemplary EOS benchtop laboratory setup used a 10 mm by 6 mm by 6 mm $LiNO_3$ crystal. For the laboratory benchtop test, the EOS was placed next to a 38 mm diameter circular metal plate with a bias of 4.2 kV applied to the plate, and then the metal body of the sensor was used as the ground plane.

Figure 2:
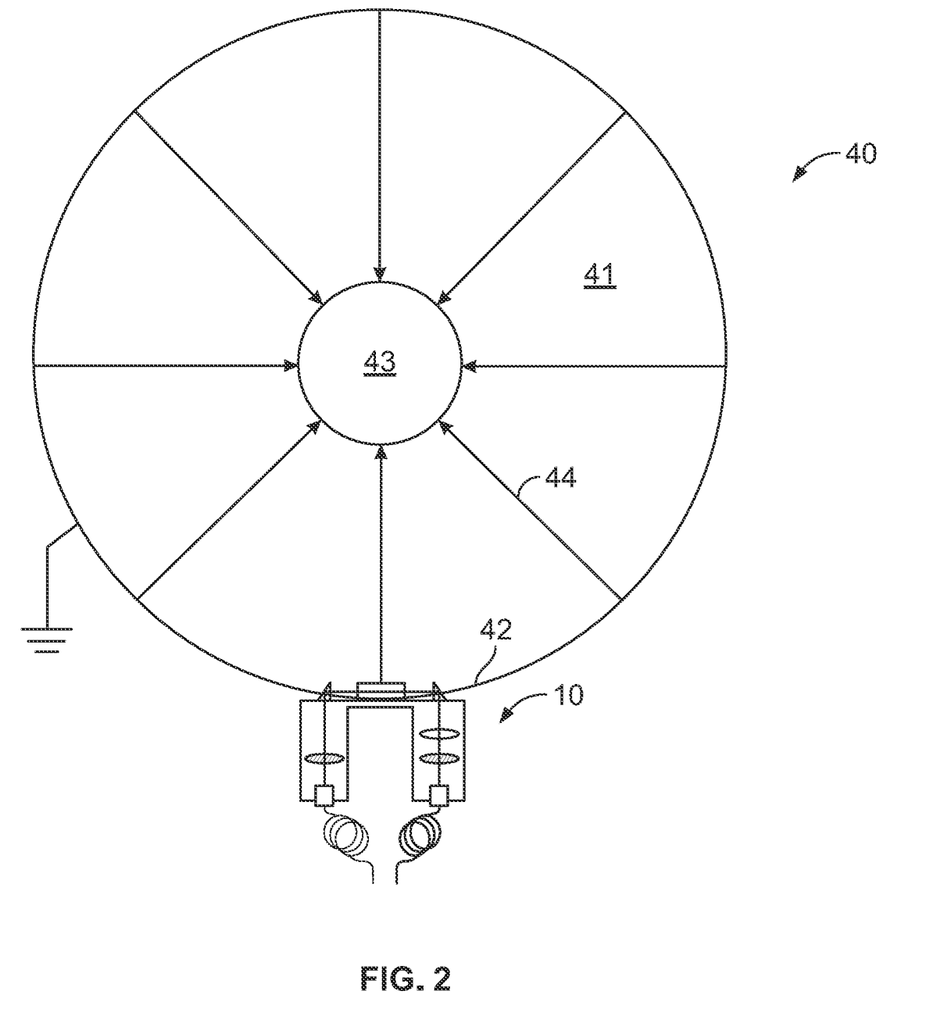
FIG. 2 is a schematic diagram of the EOS installed in the MITL region of the HERMES III pulsed power accelerator.

For a high electric field experiment on the HERMES III pulsed power accelerator, the essential device experimental parameters were the same as the laboratory benchtop experiment, but the EOS was placed in the harsh environment of a high energy pulsed power accelerator magnetically insulated transmission line (MITL) and exposed to substantially higher electric fields, electron bombardment and particle radiation. The high electric field is ultimately applied across a vacuum diode and used to accelerate electrons into a metal target, thereby producing Bremsstrahlung radiation (gamma rays) with energies up to 20 MeV. In considering the environment challenges, the EOS was very carefully designed with minimal sensing components and material protrusion into the radial gap between the MITL surface and ground. The right-angle mirrors also serve to protect the LiNO$_3$ crystal from laterally directed energetic particle bombardment.

As shown in FIG. 2, the EOS sensing surface for the high electric field experiment 40 was aligned perpendicular with the axis of the MITL 41 and positioned flush with the MITL anode's inner surface 42, placing it approximately 14 cm from the cathode stalk 43. The side region of the MITL is ideal for EOS placement as it is out of the direct path of the electron beam and gamma radiation. In this region, however, the EOS experiences a higher electric field since the 14 cm radial vacuum gap is shorter than the nominal 58 cm anode to cathode (AK) gap in the vacuum diode at the end of the cylindrical MITL stalk. As with the benchtop laboratory experiment, 532 nm light was coupled and directed through the EOS via 25-m long optical fibers. The laser, photodetector and measurement instrumentation were housed inside of a remote Faraday cage screen room. When the HERMES III accelerator shots were fired, a very high radial electric field 44 was generated in the vacuum gap between the MITL cathode stalk 43 and anode 42 which was measured by the EOS 10. Since the geometry of the MITL is fixed, it is therefore possible to determine both the electric field and applied voltage. The MITL is surrounded by trapped electron flow often referred to as an electron sheath. See P. F. Ottinger et al., *IEEE Trans. Plasma Sci.* 36, 2708 (2008). With the electron sheath, the MITL operational impedance is slightly less than the local vacuum impedance. See R. C. Pate et al., *Self-Magnetically Insulated Transmission Line (MITL) System Design for the 20-Stage Hermes-III Accelerator* (1987). However, its effect on the electric field measurement is negligible since the mm scale thickness of the sheath is short compared to the radial gap size. See P. F. Ottinger et al., *IEEE Trans. Plasma Sci.* 36, 2708 (2008).

EOS Device Theory and Physical Model

Using an electro-optical approach to determine the strength of the electric field in laboratory benchtop test and the HERMES III MITL experiment can be understood in the context of the physical process of the Pockels effect, or linear electro-optic effect. By the Pockels effect, the polarization of a light beam propagating through an electro-optical crystal will change linearly in proportion to the applied electric field. See A. Yariv, *Optical Electronics*, Holt, Rinehart, and Winston, 3rd Edition (1985). By placing a pair of crossed linear polarizers on both sides of the electro-optical crystal to equally excite vertical and horizontal optical modes in the crystal relative to the optical axis, the polarization rotation can be transformed into a modulation of optical field intensity of the transmitted beam incident on the photodetector. With a voltage $V_a$ applied across an approximate flat planar region separated by a distance s and neglecting any edge effects or surface curvature, the rotation in polarization angle $\Delta\theta_p$ can be written as:

$$\Delta\theta_p = \frac{\pi L n_o^3 r_{22} V_a}{\lambda E_3 s} \quad (1)$$

See F. Cecelja et al., *IEEE Trans. Instrum. Meas.* 50(2), 465 (2001).

Consider the benchtop laboratory and the HERMES III experiment parameters where L=10 mm is the length and d=6 mm is the thickness of the electro-optical crystal, $n_o$=2.32 is the ordinary index of refraction, $r_{22}$=6.8 pm/V is the electro-optical coefficient in lithium niobate, $\lambda$=532 nm is the laser wavelength, $E_3$ is an electric field scaling term that depends on the bulk dielectric constant ($\varepsilon$=85) and aspect ratio (L/d) of the crystal, $s_{lab}$=0.665 cm and $s_{HIII}$=14 cm are the distances between the conducting surfaces in the benchtop laboratory and in the HERMES III experiment, respectively, and $V_{lab}$=4.2 kV and $V_{HIII}$=16.25 MV are the applied voltage biases for the laboratory and HERMES III experiments, respectively. See M. Abarkan et al., *Appl. Phys. B: Lasers Opt.* 76(7), 765 (2003); T. Robinson et al., *Sci. Rep.* 7, 1 (2017); and G. A. Massey et al., *Appl. Opt.* 14(11), 2712 (1975). Then the expected polarization shifts in the laboratory and HERMES III experiments are $\Delta\theta_{lab}$=19.5° and $\Delta\theta_p$=179.0° upon converting radians to degrees.

The transmission $\eta_c$ of the optical light field through the crossed polarizers and crystal based on the shift in polarization angle $\Delta\theta_p$ can be written as:

$$\eta_c = \sin^2[\Delta\theta_p + \Delta\theta_{QWP}] \quad (2)$$

where $\Delta\theta_{QWP}$ is a quarter wave plate polarization angle adjustment to offset the natural crystal birefringence. Using the relevant values for the shift in polarization, the transmissions of the optical light field are $\eta_{lab}$=2.9% and $\eta_{HIII}$=99.0%. A complete model expression that relates the applied conducting surface voltage to the expected output voltage of a silicon photodetector can be written as:

$$V_m = P_i \eta_c \eta_o \eta_e D_r D_i D_g \quad (3)$$

where $P_i$=125 mW is the laser power, $n_o$=10.20 dB and 12.50 dB are the optical attenuation values in the benchtop laboratory and HERMES III experiment, respectively, $\eta_e$=0.2 dB is electrical attenuation in the coaxial cable connectors, $D_r$=0.195 NW is the silicon photodetector responsivity at 532 nm, $D_i$=50$\Omega$ is the detector impedance and $D_g$=15 is the gain factor of the detector's internal low noise amplifier. See I. Owens et al., "Electro-optical measurement of electric fields for pulsed power systems," in 46$^{th}$ *ICOPS* (2019). The optical attenuation is primarily from losses incurred through fiber optical cables and associated optical components. For the electrical signal attenuation, the loss value was obtained by directly connecting the silicon photodetector to the oscilloscope.

From the calculation, the expected modulation peak voltage amplitude is 46.21 mV for the laboratory experiment and 705.68 mV for HERMES III. These expected modulation voltages are well within the measurement range capability of a standard oscilloscope. In the device model, the applied MITL voltage can be considered to be determined from the radially directed electric field lines that span a distance (s=14 cm) and impinge perpendicularly on the surface of the crystal sensor. The length of the LiNO$_3$ sensor (10 mm) is significantly less than the circumference of the cylindrical MITL, and therefore curvature or field edge effects are not incorporated in the electric field calculation. The expected peak applied external electric field $E_a$ (or $V_a$/s) for the laboratory and HERMES III experiment are 6.32 kV/cm and 116 MV/m with corresponding applied voltages of 4.2 kV and 16.25 MV, respectively.

EOS Laboratory Benchtop Test Experimental Results

Figure 3:
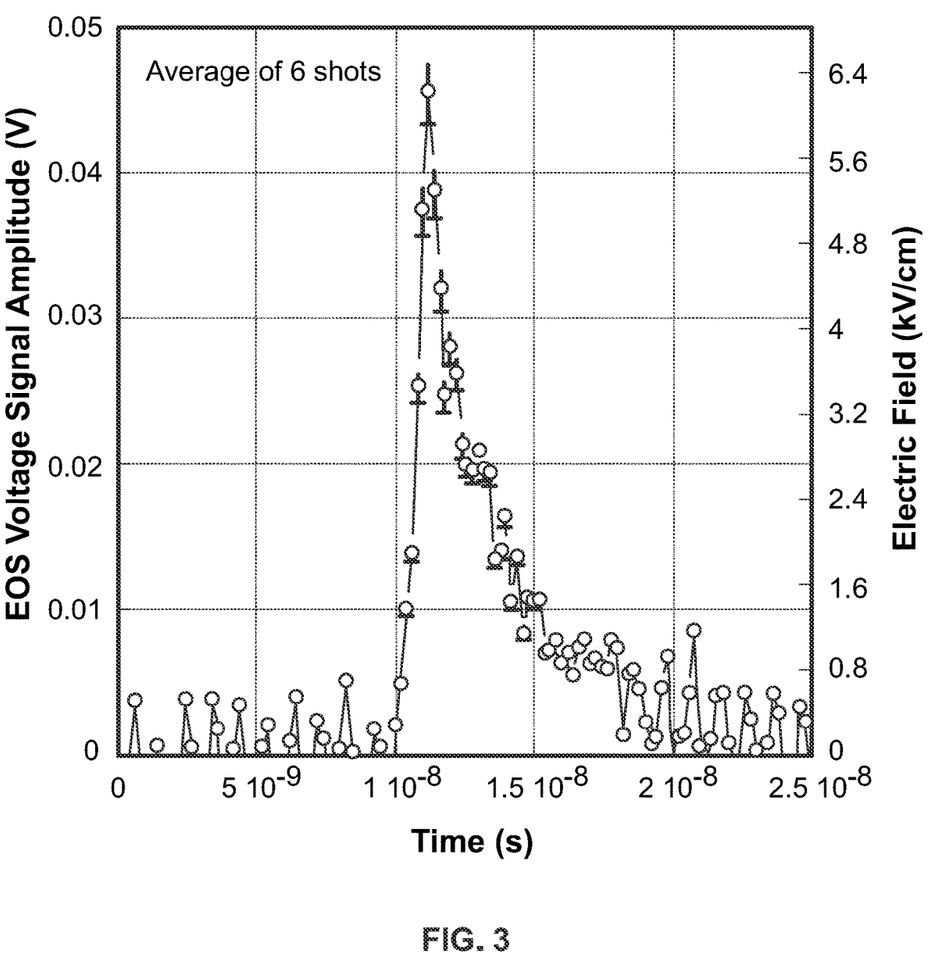
FIG. 3 is a graph of benchtop laboratory EOS signal amplitude versus time for a series of six shots. The average peak pulse amplitude and electric filed were 45.46 mV and 6.26 kV/cm compared to calculated values of 46.21 mV and 6.32 kV/cm. The average pulse width of for the EOS signals was 2.11 ns.

From the peak amplitude of the electro-optical signal generated directly from the electric field inside the EOS crystal and the known operating parameters of the system, it is possible to determine the electric field and therefore the applied voltage bias in air or vacuum. A plot of the benchtop laboratory experiment modulation voltage generated from the electro-optical signal is shown in FIG. 3. A detailed description of the properties of the 4.2 kV high voltage supply driving pulse is provided in Owens. See I. Owens et al., "Electro-optical measurement of electric fields for pulsed power systems," in 46$^{th}$ ICOPS (2019). The average peak voltage and applied external electric field value for the laboratory experiment, which is shown to be 45.46 mV and 6.26 kV/cm in the graph, is in agreement with the device modeling prediction of 46.21 mV and 6.32 kV/cm described earlier. The average pulse width for the EOS signals was 2.11 ns. The benchtop experiment electric field signal-to-noise ratio (SNR) and resolution were approximately 15.5 dB and 140 V/cm, respectively.

EOS HERMES III MITL Experimental Results

The discussion of the EOS waveforms that follows includes the model calculations, benchtop laboratory results and the responses generated by two radiation detectors in the HERMES III test cell—a PIN diode and spherical Compton diode (SCD)—that were monitored during the HERMES III experiment. During X-ray and gamma irradiation of a PIN diode detector, electron—hole pairs are generated within the silicon. This flow of carriers constitutes a photocurrent that can be measured in response to a radiation pulse. SCDs are energy resolving detectors that provide an electrical signal related to the production of secondary electrons (mostly Compton scattered electrons) following the interactions of the incident radiation with the diode. See C. R. Drumm et al., IEEE Trans. Nucl. Sci. 39(4), 584 (1992). The PIN diode and SCD were positioned 10.5 m and 40 cm in front of the radiation converter, respectively. The PIN was biased to −210 V, while the SCD does not require an external bias and can withstand close placement relative to the converter and high irradiation levels without sustaining any physical damage. The voltage output of the PIN diode and SCD detectors show the general temporal behavior of the HERMES III radiation source, but neither detector has been calibrated to provide a quantifiable radiation dose. Plots of the modulation voltage for the EOS, and the voltage output from the PIN diode and the SCD are shown versus time in FIGS. 4, 5, and 6.

Figure 4:
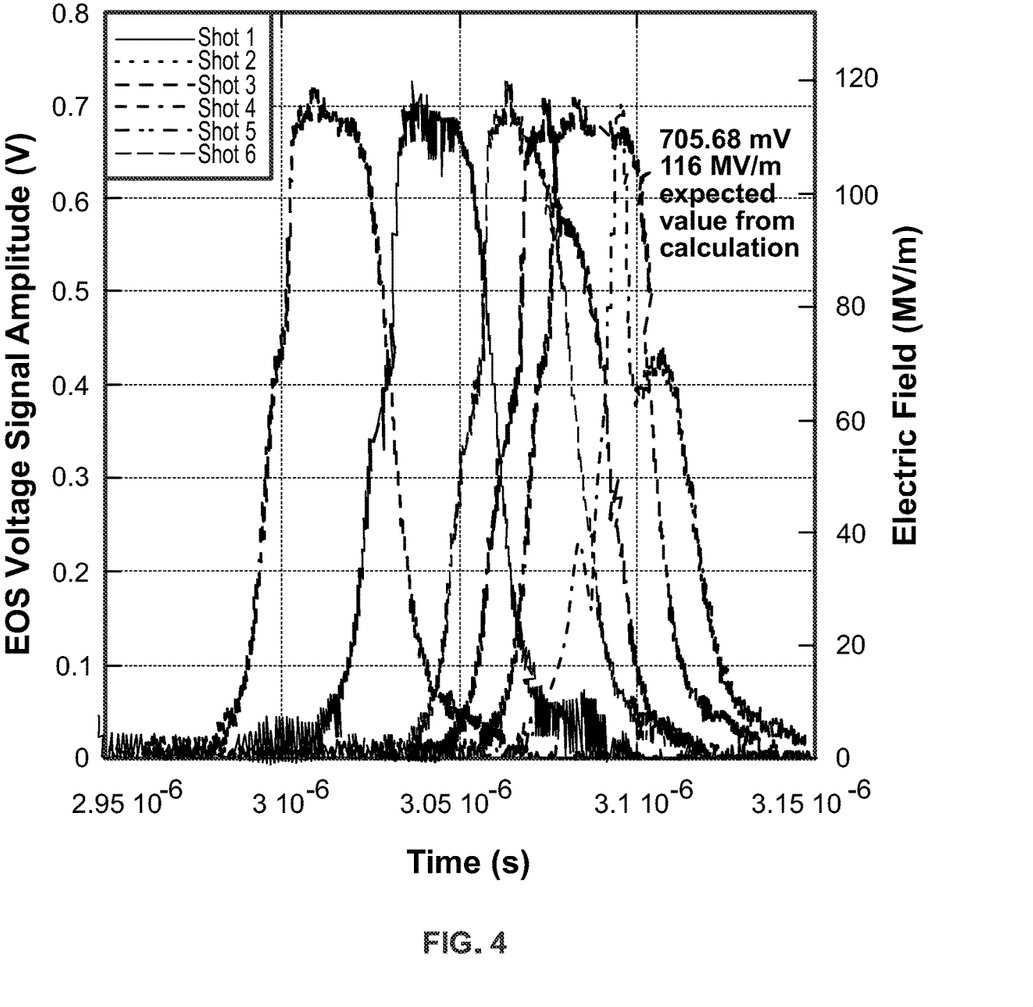
FIG. 4 is a graph of EOS signal amplitude versus time for a series of six shots on the HERMES III pulsed power accelerator. The average peak pulse amplitude and electric field were 715.66 mV and 117.86 MV/m compared to the expected values of 705.68 mV and 116 MV/m from the calculation. The average pulse width (excluding shot #4) for the EOS signals was 33.30 ns.
Figure 5:
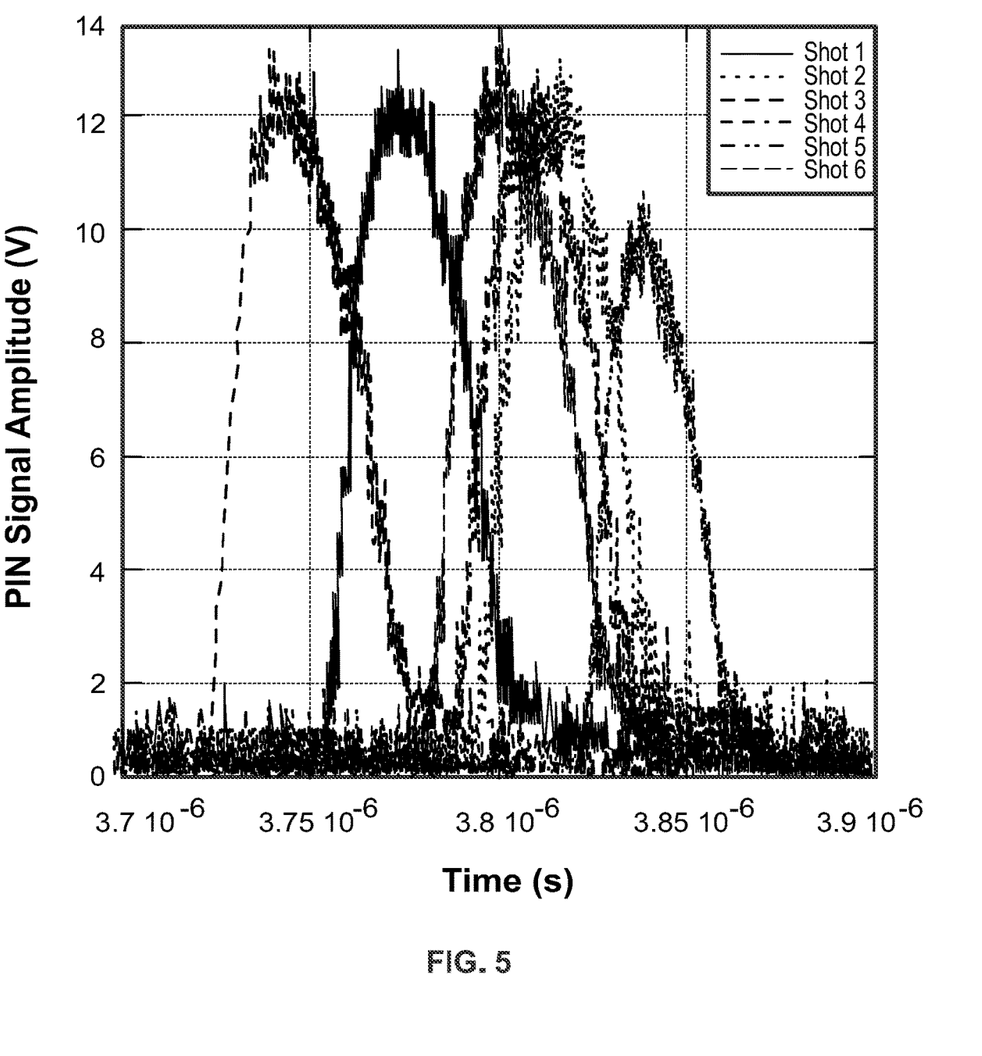
FIG. 5 is a graph of PIN diode signal amplitude versus time for a series of six shots on the HERMES III pulsed power accelerator. The average signal amplitude and pulse width (excluding shot #4) were 13.73 V and 32.24 ns, respectively.
Figure 6:
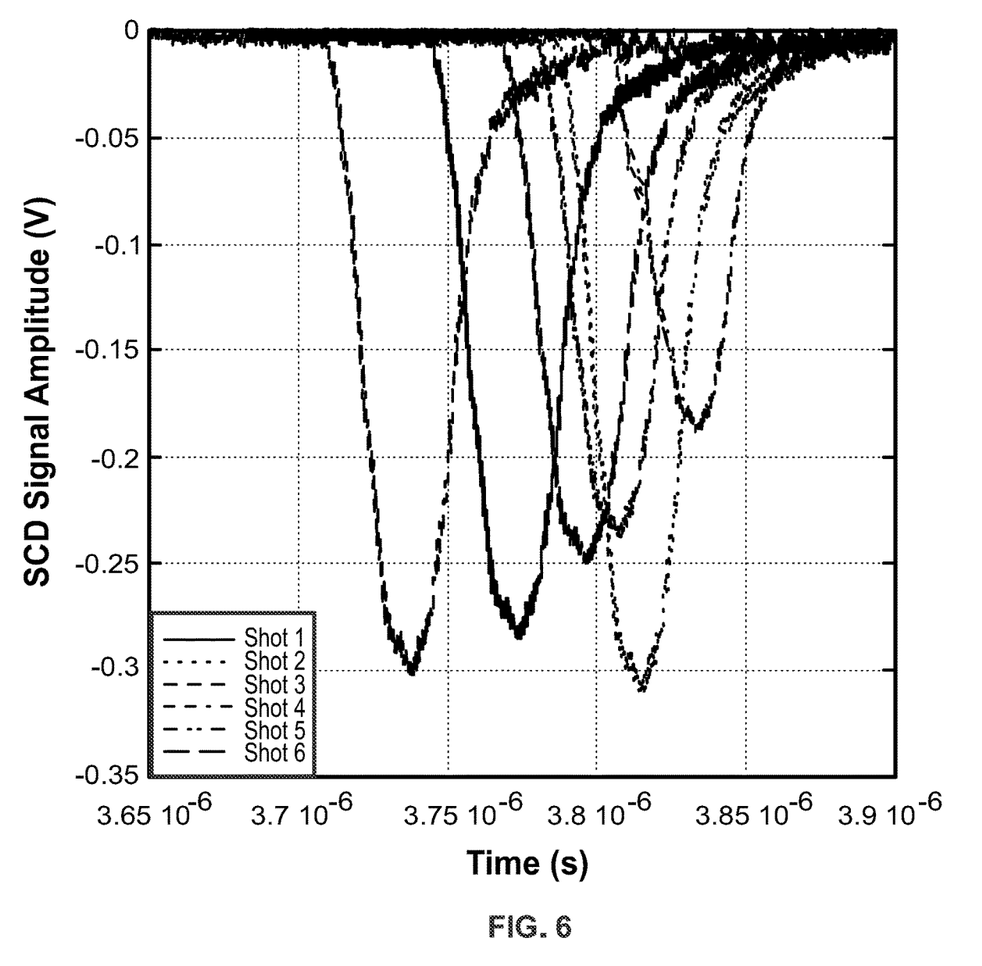
FIG. 6 is a graph of SCD signal amplitude versus time for a series of six shots on the HERMES III pulsed power accelerator. The average signal amplitude and pulse width (excluding shot #4) were −280.67 mV and 31.64 ns, respectively.

From the plot of EOS signal amplitude versus time shown in FIG. 4, it is demonstrated that the average peak amplitude and applied external electric field of 715.66 mV and 117.86 MV/m agree very well with the model calculation values of 705.68 mV and 116 MV/m. The HERMES III experiment electric field SNR and resolution were approximately 29.5 dB and 165 kV/m, respectively. The peak amplitudes and external electric field values are uniform (except for "Shot 4") over the six HERMES III shots in the series. The calculated and measured modulation voltages and electric fields correspond to radial MITL voltages of 16.25 MV to 16.5 MV. This span is within 1.75% difference and in agreement with previously estimated accelerator MITL voltages using data from conventional pulsed power diagnostics in the region where the EOS was installed. In FIGS. 5 and 6, it is shown that both the PIN and SCD produced pulses with uniform FWHM and peak amplitude values for the shot series, again with the exception of "Shot 4". Even though the PIN and SCD were external to the MITL electric field region and detected the radiation signal, the pulse width for both detectors were within 5.25% difference in value compared to the EOS. The electro-optical pulse produced by the EOS accurately reproduced the qualitative and quantitative features of the electric field waveform in the MITL of HERMES III. The EOS also reproduced higher bandwidth features of the MITL electric field waveform (e.g., "Shot 4") that were more crudely detected and recorded as reduced amplitude radiation waveforms in the PIN and SCD detectors.

In addition to the results for the qualitative and quantitative aspects of the waveforms, the EOS showed robust performance in a challenging operating environment. During the experiment, there was no sign of outgassing from the sensor materials or any decrease in quality of the usual vacuum space. Furthermore, the side mirrors protected the crystal from the possibility of direct lateral electron bombardment in the MITL during the rise and fall of the voltage pulse, the high internal field inside the crystal did not lead to dielectric breakdown, and there was no evidence of any electrical arcing on the surface. The optical fibers were outside of the vacuum chamber and positioned far away from the radiation source such that radiation darkening did not affect the light inside the optical fiber. Lithium niobate does have a notable acoustic response. See P. Basseras et al., J. Appl. Phys. 69(11), 7774 (1991). However, acoustical optical responses due to mechanical vibrations or similar effects caused by changes in temperature occur over a significantly larger time scale compared to the desired electro-optical signal, and had no interfering effect on the electric field measurement.

The present invention has been described as an electro-optical sensor for high intensity electric field measurement. It will be understood that the above description is merely illustrative of the applications of the principles of the present invention, the scope of which is to be determined by the claims viewed in light of the specification. Other variants and modifications of the invention will be apparent to those of skill in the art.

We claim:

1. An electro-optical sensor for electric field measurement, comprising:
    a light source that provides a light beam;
    a first linear polarizer that produces a linearly polarized light beam from the light beam;
    an electro-optical crystal that rotates the polarization of the linearly polarized light beam that propagates along an optical axis of the electro-optical crystal to provide a rotated linearly polarized light beam whose rotation is dependent upon the strength of an electric field applied transverse to the optical axis of the electro-optical crystal;
    a second linear polarizer that is aligned perpendicular to the first linear polarizer, thereby providing crossed linear polarizers, such that second linear polarizer transmits a light beam dependent upon the rotation of the polarization by the electro-optical crystal; and
    a photodetector that measures the intensity of the transmitted light beam.

2. The electro-optical sensor of claim 1, wherein the light source comprises an infrared or visible laser.

3. The electro-optical sensor of claim 2, wherein the infrared or visible laser comprises a 532-nm fiber-coupled laser.

4. The electro-optical sensor of claim 1, wherein the first and second linear polarizers comprise nanoparticle-coated linear polarizers.

5. The electro-optical sensor of claim 1, wherein the electro-optical crystal comprises lithium niobate.

6. The electro-optical sensor of claim 1, wherein the electro-optical crystal comprises beta barium borate or potassium dihydrogen phosphate.

7. The electro-optical sensor of claim 1, wherein the photodetector comprises a high-speed silicon or InGaAs photodetector.

8. The electro-optical sensor of claim 1, further comprises a quarter waveplate disposed between the electro-optical crystal and the second linear polarizer to offset a natural birefringence of the electro-optical crystal.

9. The electro-optical sensor of claim 1, wherein the electric field is greater than 140 V/cm.

10. The electro-optical sensor of claim 1, wherein the electric field is greater than 100 MV/m.

* * * * *